United States Patent
Fukushima et al.

(10) Patent No.: US 8,848,459 B2
(45) Date of Patent: Sep. 30, 2014

(54) SEMICONDUCTOR DEVICE

(75) Inventors: Kazuhiko Fukushima, Itami (JP); Atsuo Yamaguchi, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 289 days.

(21) Appl. No.: 13/419,229

(22) Filed: Mar. 13, 2012

(65) Prior Publication Data

US 2012/0250432 A1 Oct. 4, 2012

(30) Foreign Application Priority Data

Mar. 30, 2011 (JP) ................................. 2011-074704

(51) Int. Cl.
*G11C 7/00* (2006.01)

(52) U.S. Cl.
USPC .................. 365/189.05; 365/189.08; 365/191; 365/194

(58) Field of Classification Search
CPC ....................................................... G11C 16/10
USPC .......................... 365/189.05, 189.08, 191, 194
See application file for complete search history.

(56) References Cited

U.S. PATENT DOCUMENTS 7,490,195 B2 * 2/2009 Sumita .......................... 711/108
7,911,858 B2 * 3/2011 Sugishita ...................... 365/191

FOREIGN PATENT DOCUMENTS

| JP | 3-276346 A | 12/1991 |
| JP | 6-295267 A | 10/1994 |
| JP | 2000-137696 A | 5/2000 |

* cited by examiner

*Primary Examiner* — Son Dinh
(74) *Attorney, Agent, or Firm* — Miles & Stockbridge P.C.

(57) ABSTRACT

To provide a semiconductor device which can perform initialization to a first state of two states of the first state and a second state, and which can generate a signal having a potential corresponding to the initialized first state. The present invention is the semiconductor device which can perform initialization to "0" (a first state) of two states of "0" and "1" (a second state), and which can generate a signal having a potential corresponding to initialized "0". The semiconductor device 10 includes a plurality of flip-flop circuits 2 that are connected in parallel and which can hold the two states of "0" and "1"; and an AND circuit 3 which generates and outputs a signal having a potential corresponding to "0" when a state held in at least one flip-flop circuit 2 among the flip-flop circuits 2 is "0". The AND circuit is connected to the flip-flop circuits 2.

10 Claims, 9 Drawing Sheets

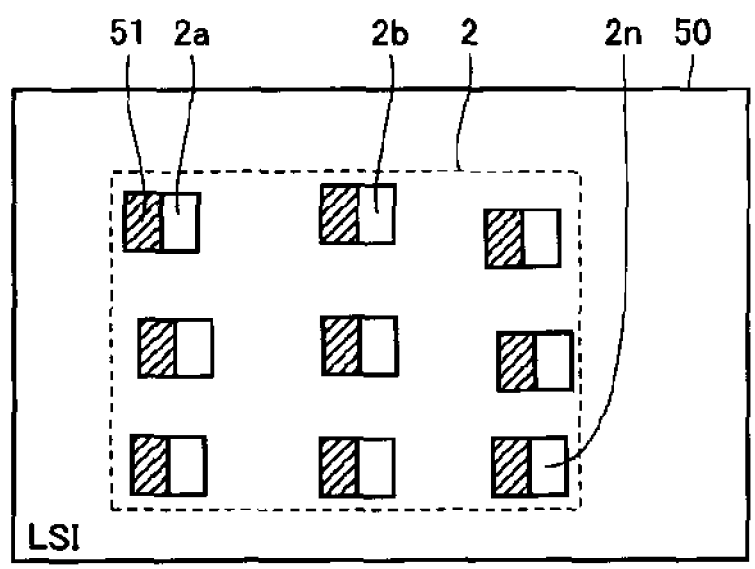

SEMICONDUCTOR DEVICE

CROSS-REFERENCE TO RELATED APPLICATION

The disclosure of Japanese Patent Application No. 2011-74704 filed on Mar. 30, 2011 including the specification, drawings and abstract is incorporated herein by reference in its entirety.

BACKGROUND

The present invention relates to a semiconductor device and, in particular, to a semiconductor device which can perform initialization to a first state of two states of the first state and a second state, and which can generate a signal having a potential corresponding to the initialized first state.

In recent years, to protect information property, there has been developed a semiconductor device (an LSI or the like) provided with a micro control unit (MCU) used for security which can read data from a memory only when permitted by authentication. Because this semiconductor device initializes an enable signal that permits reading data from the memory (it performs initialization to "0" of two states of "0" (non-permission for reading data) and "1" (permission for reading data)) by power-on reset (initialization at the time of starting a power supply), the data cannot usually be read from the memory.

Power-on reset is performed in a power-on reset circuit including a power supply voltage detection circuit that detects whether or not a rising voltage when a power supply is started is not less than a reference voltage; and a reset circuit which generates an initialization signal when the power supply voltage detection circuit detects a rising voltage not less than the reference voltage.

However, when the power-on reset circuit operates under a temperature condition or a power supply condition, except for an operation guaranteed range, there has been a case in which the power-on reset circuit cannot generate a normal initialization signal, and cannot initialize the enable signal. When the enable signal cannot be initialized, there has been a case in which the semiconductor device can always read data from the memory. There exists a method for attacking the semiconductor device, which is intentionally operated under the temperature condition or the power supply condition, except for the operation guaranteed range as described above and which attempts unauthorized access to confidential information stored in the memory.

In addition, when the power-on reset circuit cannot generate the normal initialization signal, there has been a possibility that processing of a program stored in the memory goes out of control. Japanese Patent Laid-Open No. 2000-137696 (Patent Document 1) discloses a configuration in which even though a normal initialization signal cannot be generated, and processing of a program stored in a nonvolatile memory goes out of control, erroneous rewrite of the program content can be prevented.

When the power-on reset circuit cannot generate the normal initialization signal, it is necessary to take measures for every failure, such as preventing erroneous rewrite of the program content in the same way as in the nonvolatile memory disclosed in Patent Document 1.

However, when taking measures for every failure, it is necessary for the semiconductor device to include a plurality of configurations which can achieve processing, such as preventing erroneous rewrite of the program content (such as usually making it impossible to read data from the memory), and the configurations become complex. Even though measures are not taken for every failure, and the power-on reset circuit cannot generate the normal initialization signal under the temperature condition or the power supply condition, except for the operation guaranteed range, it is not necessary for the semiconductor device to take measures for every failure if a signal having a potential corresponding to an initialized state can be generated.

Therefore, the present invention has been made to solve the above described problems, and an object of the present invention is to provide a semiconductor device which can perform initialization to a first state of two states of the first state and a second state, and which can generate a signal having a potential corresponding to the initialized first state.

SUMMARY

To solve the above-mentioned problems, the present invention is a semiconductor device which can perform initialization to a first state of two states of the first state and a second state, and which can generate a signal having a potential corresponding to the initialized first state, and the semiconductor device includes a plurality of state holding circuits which are connected in parallel and which can hold the two states of the first state and the second state; and a logic circuit which generates and outputs the signal having a potential corresponding to the first state when a state held in at least one state holding circuit among the state holding circuits is the first state and which is connected to the state holding circuits.

In the semiconductor device according to the present invention, the state holding circuits which can hold the two states of the first state and the second state are connected in parallel, and when the state held by at least one state holding circuit among the state holding circuits is the first state, the logic circuit generates and outputs the signal having a potential corresponding to the first state. Therefore, the logic circuit can generate the signal having a potential corresponding to the first state except for the case in which a state held in each state holding circuit is all the second state, and a probability of generating the signal having a potential corresponding to the initialized first state can be increased even under the temperature condition or the power supply condition, except for the operation guaranteed range. Because the semiconductor device can increase the probability of generating the signal having a potential corresponding to the initialized first state, it is possible to prevent the data from leaking outside, prevent the circuit produced to properly operate through initialization from performing an abnormal operation and breaking, and prevent processing of program stored in the memory from going out of control, by initializing an enable signal to usually make it impossible to read data from the memory.

BRIEF DESCRIPTION OF THE DRAWINGS

FIG. 9 is a schematic diagram showing a configuration of a semiconductor device in accordance with Embodiment 5 of the present invention.

DETAILED DESCRIPTION

Embodiments in accordance with the present invention will be described with reference to drawings.

(Embodiment 1)

Figure 1:
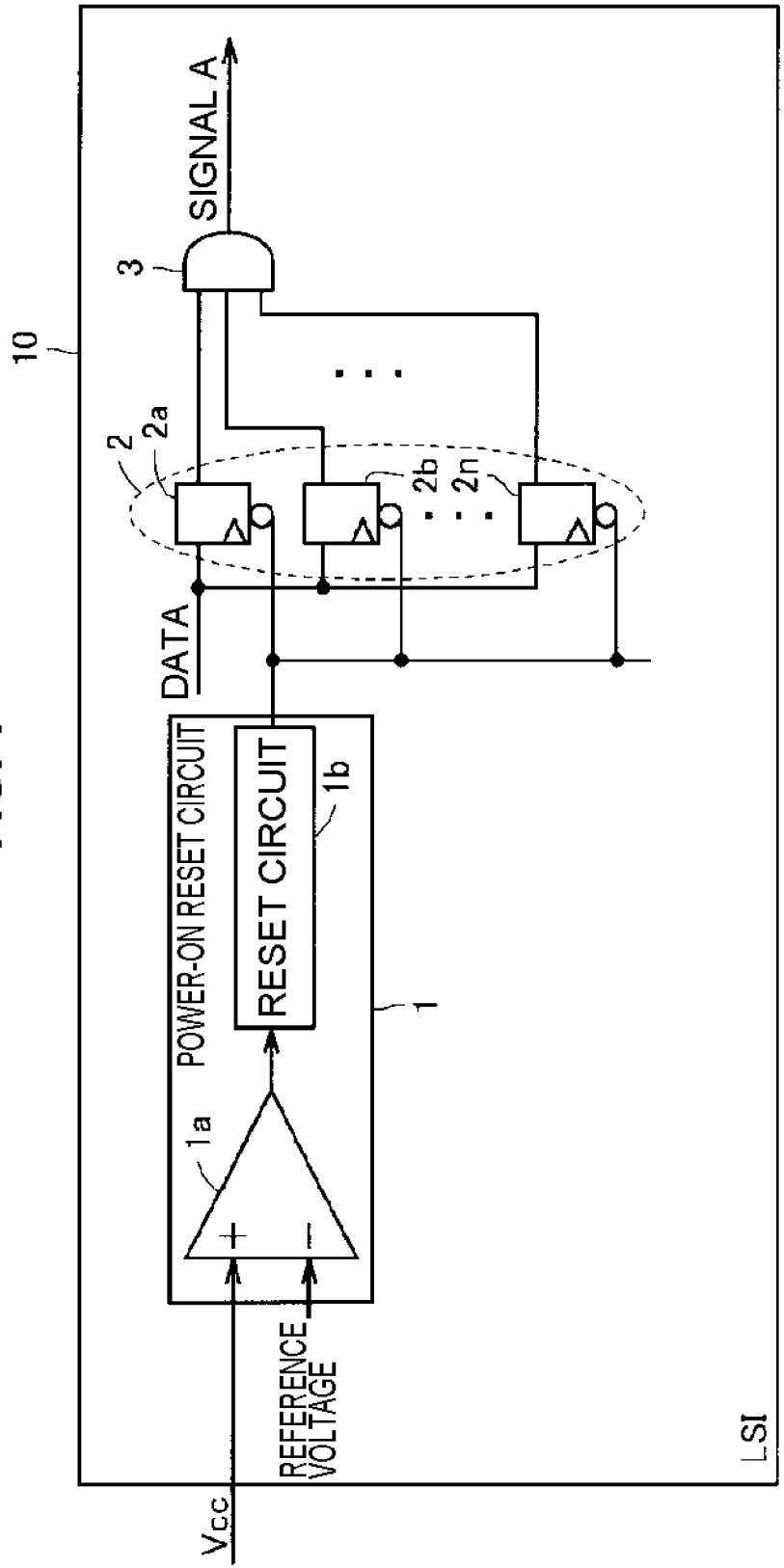
FIG. 1 is a schematic diagram showing a configuration of a semiconductor device in accordance with Embodiment 1 of the present invention.

FIG. 1 is a schematic diagram showing a configuration of a semiconductor device in accordance with Embodiment 1 of the present invention. A semiconductor device (an LSI or the like) 10 shown in FIG. 1 includes a power-on reset circuit 1, a plurality of flip-flop circuits 2, and an AND circuit 3. The semiconductor device 10 performs initialization to "0" (a first state) of two states of "0" and "1" (a second state), and can generate a signal A having a potential corresponding to initialized "0". Although the signal having a potential corresponding to "0" (the first state) of the two states of "0" and "1" (the second state) is described as the signal A, a signal having a potential corresponding to "1" (the first state) of the two states of "1" and "0" (the second state) may be defined as the signal A.

The power-on-reset circuit 1 is the circuit which generates an initialization signal to perform power-on reset (initialization at the time of starting a power supply) in which the reaching of a power supply voltage Vcc, which is externally supplied, to a reference voltage level is detected, and in which various circuits in the semiconductor device 10 are initialized. Specifically, the power-on reset circuit 1 includes a power supply voltage detection circuit 1a and a reset circuit 1b.

The power supply voltage detection circuit 1a detects whether or not a rising voltage when the power supply is started is not less than the reference voltage. The reset circuit 1b generates the initialization signal when the power supply voltage detection circuit 1a detects the rising voltage that is not less than the reference voltage.

The flip-flop circuit 2 is the circuit which can hold the two states of "0" and "1", and the circuit 2 is initialized to "0" by the initialization signal, and generates and outputs the signal A having a potential corresponding to initialized "0".

However, when the power-on reset circuit 1 is operated by operating the semiconductor device under a temperature environment and under an electromagnetic noise environment, except for an operation guaranteed range, or by applying, as the power supply voltage Vcc, a pulsed voltage in which a voltage level changes to not more than the reference voltage after exceeding the reference voltage for a short time (hereinafter referred to as operation under an inappropriate environment), there is a case in which the power-on-reset circuit 1 cannot generate the normal initialization signal (an initialization signal having a potential corresponding to "0") due to operation failure of the power supply voltage detection circuit 1a or the reset circuit 1b.

Since the flip-flop circuit 2 cannot be initialized when the power-on reset circuit 1 cannot generate the normal initialization signal, the flip-flop circuit 2 cannot be initialized to "0", and cannot generate and output the signal A having a potential corresponding to initialized "0". In a case that the flip-flop circuit 2 cannot generate the signal A having a potential corresponding to "0", when a circuit located at a subsequent stage of the flip-flop circuit 2 is the circuit produced to operate properly by initialization, there has been a possibility that the circuit may unusually operate. Furthermore, when the signal A having a potential corresponding to "0" cannot be generated, there has been a possibility that processing of the program stored in the memory goes out of control.

Consequently, in the semiconductor device 10 in accordance with Embodiment 1 of the present invention, a plurality of n pieces of flip-flop circuits 2a to 2n is connected in parallel, and the n pieces of flip-flop circuits 2a to 2n are connected to the AND circuit 3 such that they can generate the signal A having a potential corresponding to initialized "0" even in an operational condition under the inappropriate environment.

As described above, when the power-on reset circuit 1 operates in the operational condition under the inappropriate environment, the initialization signal cannot be generated due to operation failure of the power supply voltage detect ion circuit 1a or the reset circuit 1b. Therefore, each of the n pieces of flip-flop circuits 2a to 2n is not initialized to "0", and holds the state of either "0" or "1" depending on a potential state of an internal node, variability of an individual product with respect to an external environment or the like.

When a state held in at least one of the flip-flop circuits 2a to 2n among the n pieces of flip-flop circuits 2a to 2n is "0", the AND circuit 3 generates and outputs the signal A having a potential corresponding to "0". That is, the AND circuit 3 generates and outputs the signal A having a potential corresponding to "0" except for the case in which the state held in each of the flip-flop circuits 2a to 2n is all "1".

For example, when a probability of the "0" or "1" state held in each of the flip-flop c circuits 2a to 2n is defined to be equal to each other, a probability P that the state held in each of the flip-flop circuits 2a to 2n is all "1" is $P=(1/2)^n$. Therefore, the more the number (=n) of the flip-flop circuits 2a to 2n increases, the more the probability of generating the signal A having a potential corresponding to "0" increases. Specifically, when the number of the flip-flop circuits 2a to 2n is defined to be 32 (n=32), the probability P that the state held in each of the flip-flop circuits 2a to 2n is all "1" is $P=(1/2)^{32}=2.3\times10^{-10}$. Thus, the probability becomes sufficiently low.

Accordingly, in the semiconductor device 10, even when the power-on reset circuit 1 cannot generate the initialization signal in the operational condition under the inappropriate environment, the probability of generating the signal A having a potential corresponding to "0", which is the state of having initialized the flip-flop circuit 2, can be increased.

As described above, in the semiconductor device 10 in accordance with Embodiment 1 of the present invention, the flip-flop circuits 2a to 2n which can hold the two states of "0" and "1" are connected in parallel, and when the state held in at least one of the flip-flop circuits 2a to 2n among the n pieces of flip-flop circuits 2a to 2n is "0", the AND circuit 3 generates and outputs the signal A having a potential corresponding to "0". Therefore, the AND circuit 3 can generate the signal A having a potential corresponding to "0" except when the state held in each of the flip-flop circuits 2a to 2n is all "1", and a probability of generating the signal having a potential corresponding to initialized "0" can be increased even under the temperature condition or the power supply condition, except for the operation guaranteed range.

Since the probability of generating the signal A having a potential corresponding to initialized "0" can be increased in the semiconductor device 10, it is possible to prevent the data from leaking outside, prevent the circuit produced to properly operate through initialization from performing an abnormal operation and breaking, and prevent processing of program stored in the memory from going out of control, by initializing an enable signal to usually make it impossible to read data from the memory.

Although a case has been described, in which initialization to "0" is performed and the signal A having a potential corresponding to initialized "0" is generated in the above-mentioned semiconductor device 10, a case may be described, in which initialization to "1" is performed and the signal A having a potential corresponding to initialized "1" is generated. The case applies to which the signal having a potential corresponding to "1" (the first state) of the two states of "1" and "0" (the second state) is defined as the signal A. Because the semiconductor device has the same configuration and operation as the semiconductor device 10 in FIG. 1 except for a configuration using an OR circuit instead of the AND circuit 3, detailed description of the semiconductor device 10 is omitted.

In addition, although the flip-flop circuits 2a to 2n are used in the semiconductor device 10, the circuit may be a memory circuit, such as a latch circuit and an SRAM if it is a state holding circuit which can hold the two states of "0" and "1". A circuit configuration of the semiconductor device 10 can be simplified by using the flip-flop circuit or the latch circuit as the state holding circuit.

MODIFIED EXAMPLE

Furthermore, even in the operation condition under the inappropriate environment, the configuration of the semiconductor device 10, in which the signal A having a potential corresponding to initialized "0" is generated, is not limited to the configuration in which the n pieces of flip-flop circuits 2a to 2n and the AND circuit 3 are connected to the subsequent stage of the reset circuit 1b.

Figure 2:
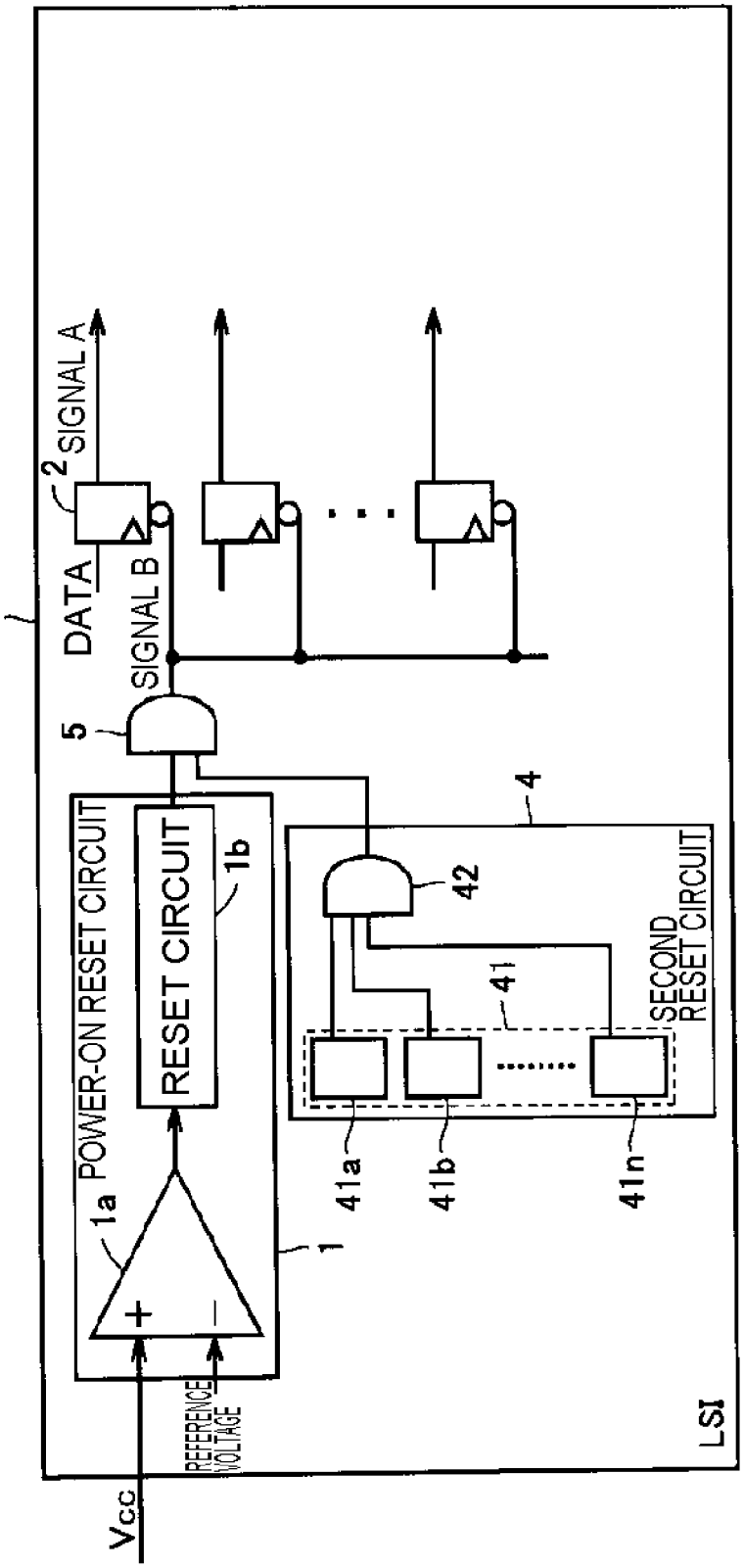
FIG. 2 is a schematic diagram showing another configuration of the semiconductor device in accordance with Embodiment 1 of the present invention.

FIG. 2 is a schematic diagram showing another configuration of the semiconductor device in accordance with Embodiment 1 of the present invention. In a semiconductor device 11 in FIG. 2, a second reset circuit 4 including a plurality of latch circuits 41a to 41n and an AND circuit 42 is connected in parallel to the reset circuit 1b.

In the second reset circuit 4, the latch circuit 41 is used as the circuit which can hold the two states of "0" and "1" instead of using a flip-flop circuit.

Figure 3:
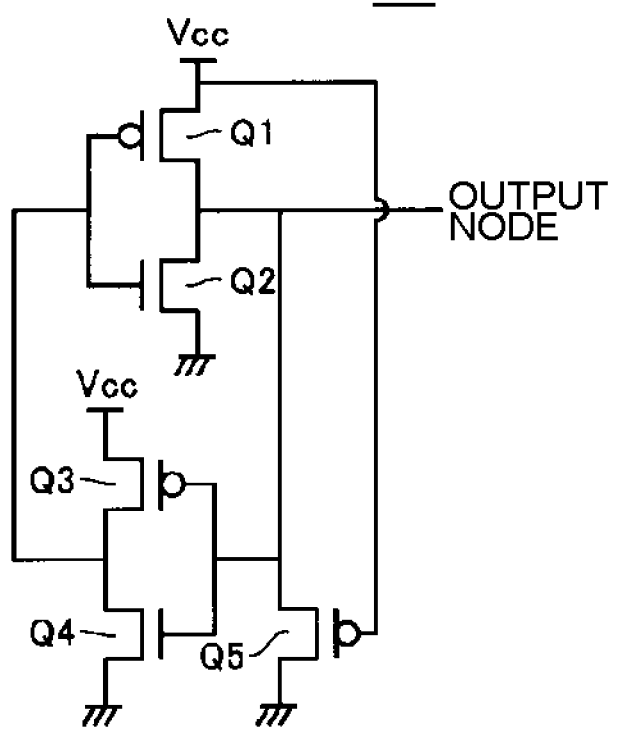
FIG. 3 is a circuit diagram showing a configuration of a latch circuit.

FIG. 3 is a circuit diagram showing a configuration of the latch circuit 41a. The latch circuit 41a in FIG. 3 includes a CMOS inverter including a P channel MOS transistor Q1 and an N channel MOS transistor Q2; and a CMOS inverter including a P channel MOS transistor Q3 and an N channel MOS transistor Q4, and an input and an output of each of the CMOS inverters are connected to each other. Furthermore, the latch circuit 41a includes a P channel MOS transistor Q5 whose gate electrode is connected to the power supply Vcc, whose drain electrode to an output node, and whose source electrode to a ground electrode.

A threshold voltage (switching voltage) of the P channel MOS transistor Q5 is higher than that of the P channel MOS transistor Q1. Therefore, because the P channel MOS transistor becomes an on-state earlier than the P channel MOS transistor Q5 in the latch circuit 41a when a voltage of the power supply Vcc decreases, it becomes easy to pull out a charge from the output node in power-off operation in the semiconductor device 11. In addition, because the P channel MOS transistor is in the on-state until a voltage level of the power supply Vcc exceeds the threshold voltage of the P channel MOS transistor Q5 also at the time of power-on operation in the semiconductor device 11, it becomes easy to pull out the charge from the output node of the latch circuit 41a also in the meantime. Because configurations of the latch circuits 41b to 41n are the same as the configuration of the latch circuit 41a, the detailed description is omitted. In addition, it is also possible to use a latch circuit having a characteristic of an inverse logic using an N channel MOS transistor instead of the P channel MOS transistor Q5.

In each of the n pieces of latch circuits 41a to 41n, initialization of the output node is performed depending on the voltage level of the power supply Vcc. Therefore, the n pieces of latch circuits 41a to 41n are difficult to be affected by effects of data to be input, an external environment, compared with the n pieces of flip-flop circuits 2a to 2n of FIG. 1, and thus a bias holding the state of "0" becomes higher.

When a state held in at least one of the latch circuits 41a to 41n among the latch circuits 41a to 41n is "0", the AND circuit 42 generates and outputs a second initialization signal having a potential corresponding to "0". The AND circuit 42 generates and outputs the second initialization signal having a potential corresponding to "0" except when the state held in each of the latch circuits 41a to 41n is all "1".

In the second reset circuit 4, a probability of generating the second initialization signal having a potential corresponding to "0" can be increased. Therefore, an AND circuit 5 can generate and output a signal B having a potential corresponding to "0" by performing an AND logical operation of the initialization signal of the power-on reset circuit 1 and the second initialization signal of the second reset circuit 4 even though the initialization signal of the power-on reset circuit 1 outputs the initialization signal having a potential corresponding to "1", which is not the normal initialization signal.

The signal B output from the AND circuit 5 is an initialization signal that initializes the flip-flop circuit 2. Therefore, when the signal B is input, the flip-flop circuit 2 can be initialized, and it is initialized to "0", and generates and outputs the signal A having a potential corresponding to initialized "0".

As described above, in the semiconductor device 11, even though the second reset circuit 4 including the latch circuits 41a to 41n and the AND circuit 42 is connected in parallel to the reset circuit 1b, the signal A having a potential corresponding to "0" can be generated.

(Embodiment 2)

Figure 4:
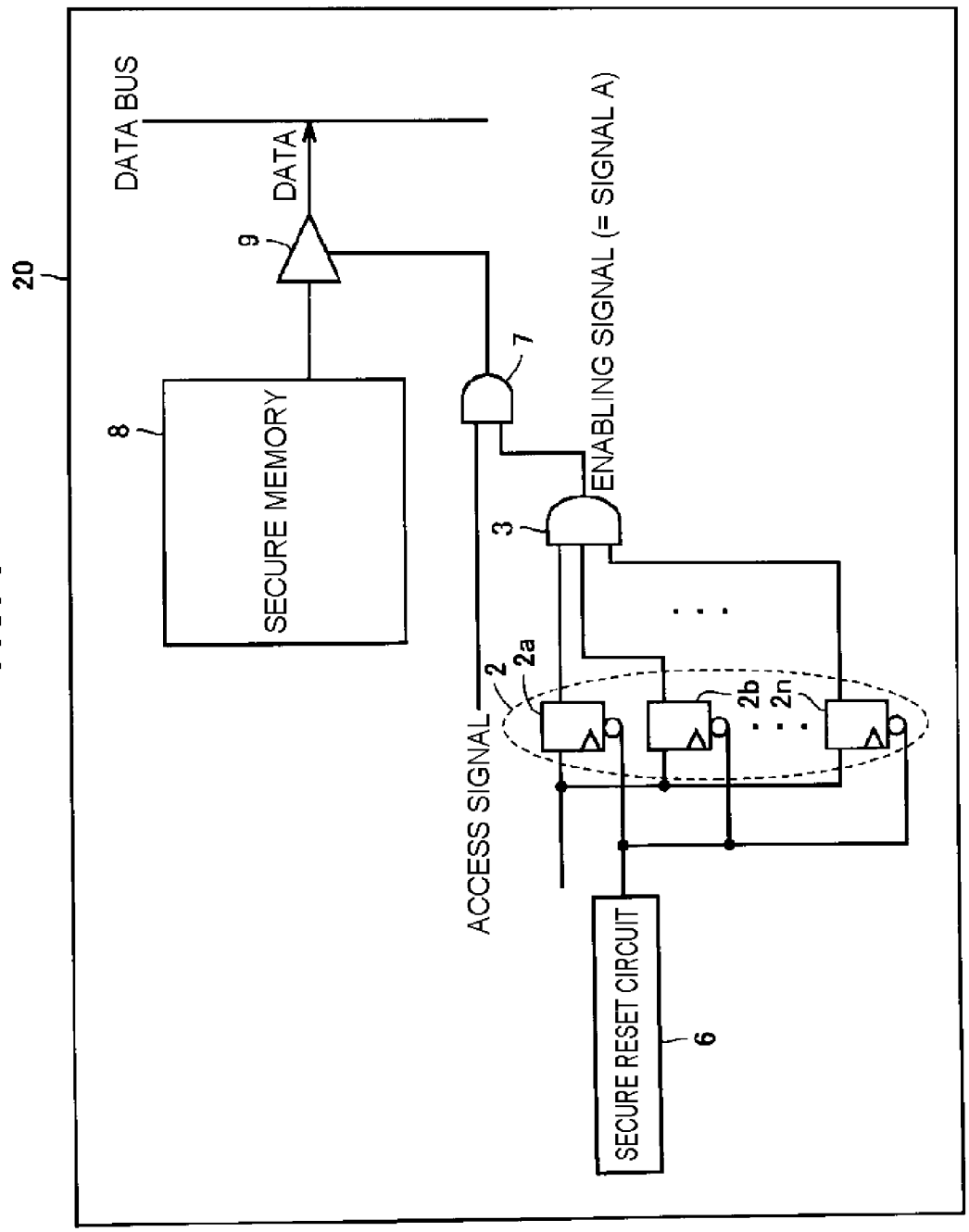
FIG. 4 is a schematic diagram showing a configuration of a semiconductor device in accordance with Embodiment 2 of the present invention.

FIG. 4 is a schematic diagram showing a configuration of a semiconductor device in accordance with Embodiment 2 of the present invention. A semiconductor device (an LSI or the like) 20 in FIG. 4 includes a secure reset circuit 6, a plurality of flip-flop circuits 2, AND circuits 3 and 7, a secure memory 8, and a gate circuit 9. The semiconductor device 20 uses the signal A having a potential corresponding to "0" generated and output by the AND circuit 3 as an enable signal for reading data stored in the secure memory 8.

Next, operation of the semiconductor device 20 will be described. The secure reset circuit 6 generates and outputs an initialization signal to initialize the flip-flop circuit 2 for generating the enable signal. However, when the secure reset circuit 6 operates in the operational condition under the inappropriate environment, the initialization signal cannot be generated due to operation failure in some cases.

Because the flip-flop circuit 2 cannot be initialized when the secure reset circuit 6 cannot generate the normal initialization signal, initialization to "0" cannot be performed, and the enable signal having a potential corresponding to initialized "0" cannot be generated and output. In the enable signal having a potential corresponding to "0", reading data from the secure memory 8 is defined as non-permission (non-permission for reading data), and in an enable signal having a potential corresponding to "1", reading data from the secure memory 8 is defined as permission (permission for reading data).

Because the flip-flop circuit 2 outputs the enable signal having a potential corresponding to "1" depending on the holding state when the flip-flop circuit 2 cannot generate the enable signal having a potential corresponding to "0", it becomes always possible to read the data from the secure memory 8.

Consequently, in the semiconductor device 20 in accordance with Embodiment 2 of the present invention, the n pieces of flip-flop circuits 2a to 2n are connected in parallel, and the flip-flop circuits 2a to 2n are connected to the AND circuit 3 such that they can generate the enable signal having a potential corresponding to initialized "0" even when the secure reset circuit 6 cannot generate the initialization signal in the operational condition under the inappropriate environment.

As mentioned above, when the secure reset circuit 6 operates in the operational condition under the inappropriate environment, the initialization signal cannot be generated due to operation failure. Therefore, the n pieces of flip-flop circuits 2a to 2n are not initialized to "0", and hold the state of either "0" or "1" depending on data to be input and the external environment.

When the state held in at least one of the flip-flop circuits 2a to 2n among the n pieces of flip-flop circuits 2a to 2n is "0", the AND circuit 3 generates and outputs the enable signal having a potential corresponding to "0". The AND circuit 3 generates and outputs the enable signal having a potential corresponding to "0" except when the state held in each of the flip-flop circuits 2a to 2n is all "1".

Accordingly, in the semiconductor device 20, even though the secure reset circuit 6 cannot generate the initialization signal under the temperature condition or the power supply condition, except for the operation guaranteed range, a probability of generating the enable signal having a potential corresponding to "0", which is the state of having initialized the flip-flop circuit 2, can be increased.

An AND circuit 7 outputs a control signal of the gate circuit 9 by performing an AND logical operation of an access signal and the enable signal output from the AND circuit 3. When the enable signal having a potential corresponding to "0" (non-permission for reading data) is input in the AND circuit 7, the AND circuit 7 outputs a control signal having a potential corresponding to "0" even though the access signal to be input is either of "0" (no access) or "1" (access). When the control signal having a potential corresponding to "0" is input from the AND circuit 7, the gate circuit 9 does not output the data stored in the secure memory 8 to a data bus.

When the data stored in the secure memory 8 is read, the state held in each of the flip-flop circuits 2a to 2n is all set to be "1", and the enable signal having a potential corresponding to "1" (permission for reading data) is output from the AND circuit 3. In a case that the enable signal having a potential corresponding to "1" is input in the AND circuit 7, when the access signal to be input is "1" (access), the AND circuit 7 outputs a control signal having a potential corresponding to "1". When the control signal having a potential corresponding to "1" is input from the AND circuit 7, the gate circuit 9 outputs the data stored in the secure memory 8 to the data bus.

Figure 5:
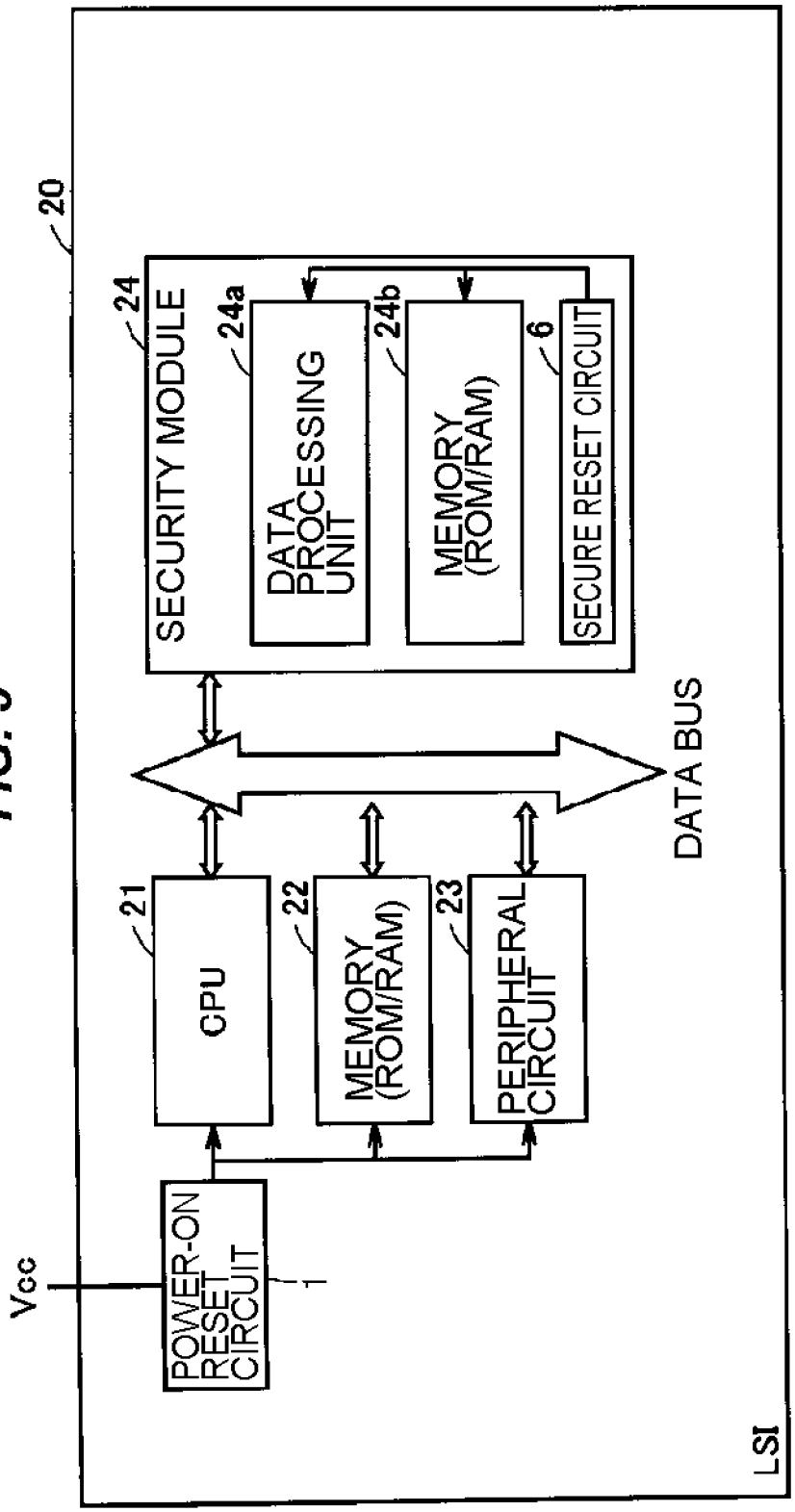
FIG. 5 is a block diagram showing a relation between a secure reset circuit and a power-on reset circuit of the semiconductor device in accordance with Embodiment 2 of the present invention.

Next, a relation between the secure reset circuit 6 and the power-on reset circuit 1 will be described. FIG. 5 is a block diagram showing a relation between the secure reset circuit 6 and the power-on reset circuit 1 of the semiconductor device 20 in accordance with Embodiment 2 of the present invention. The semiconductor device 20 in FIG. 5 includes a CPU21, a memory (a ROM and a RAM) 22, and a peripheral circuit 23 that are connected to the power-on reset circuit 1, and a security module 24.

The CPU21, the memory 22, and the peripheral circuit 23 perform initialization based on the initialization signal output from the power-on reset circuit 1. The power-on reset circuit 1 may have a configuration including the configurations (configurations of the flip-flop circuits 2a to 2n and the AND circuit 3) described in Embodiment 1.

The security module 24 includes a data processing unit 24a and a memory (a ROM and a RAM) 24b connected to the secure reset circuit 6. The data processing unit 24a and the memory 24b perform initialization based on the initialization signal output from the secure reset circuit 6. The data processing unit 24a and the memory 24b include configurations of the flip-flop circuits 2a to 2n for generating the enable signal and the AND circuit 3 in FIG. 4. Therefore, the AND circuit 3 initializes the flip-flop circuit 2 to "0" based on the initialization signal output from the secure reset circuit 6, and outputs the enable signal having a potential corresponding to initialized "0" (non-permission for reading data) to the data processing unit 24a and the memory 24b, such that data cannot be read from the data processing unit 24a and the memory 24b.

In addition, the secure reset circuit 6 is provided in the security module 24 separately from the power-on reset circuit 1 in the semiconductor device 20 in FIG. 5. As a result, because the semiconductor device 20 can generate the initialization signal in the secure reset circuit 6 independently from the initialization signal generated in the power-on reset circuit 1, the data leaks from the data processing unit 24a and the memory 24b to the outside can be prevented without being affected by operation failure of the power-on reset circuit 1.

The semiconductor device 20 is not limited to the configuration in which the secure reset circuit 6 and the power-on reset circuit 1 are separately provided, and may have a configuration in which the power-on reset circuit 1 includes the secure reset circuit 6.

As described above, because the semiconductor device 20 in accordance with Embodiment 2 of the present invention uses the signal A generated by the AND circuit 3 as the enable signal for reading the data stored in the secure memory 8, a probability that the enable signal generates the signal A having a potential corresponding to "0" can be increased and thus, usually, data cannot be read from the secure memory 8, such that the data leaks to the outside can be prevented.

(Embodiment 3)

Figure 6:
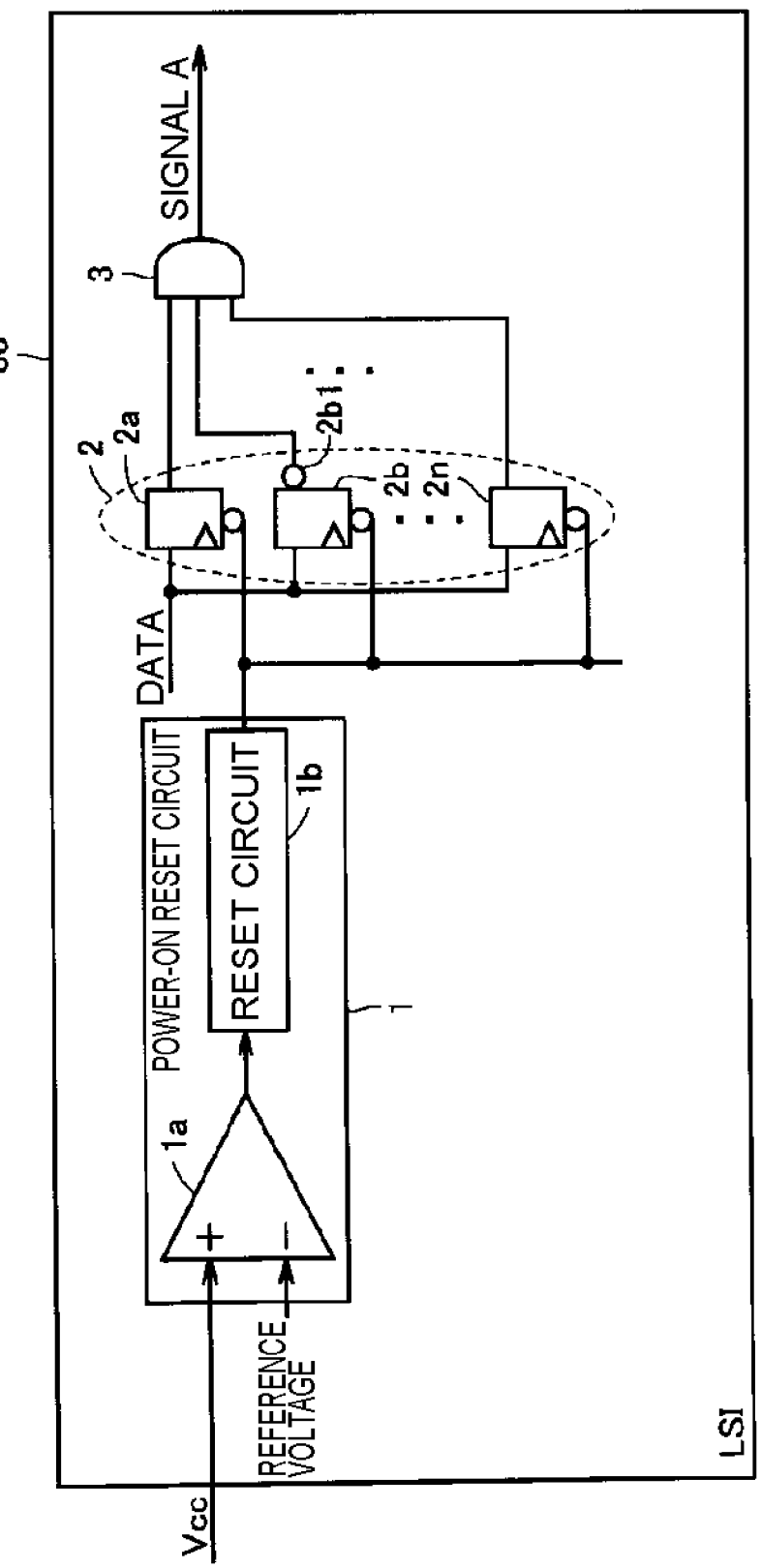
FIG. 6 is a schematic diagram showing a configuration of a semiconductor device in accordance with Embodiment 3 of the present invention.
Figure 7:
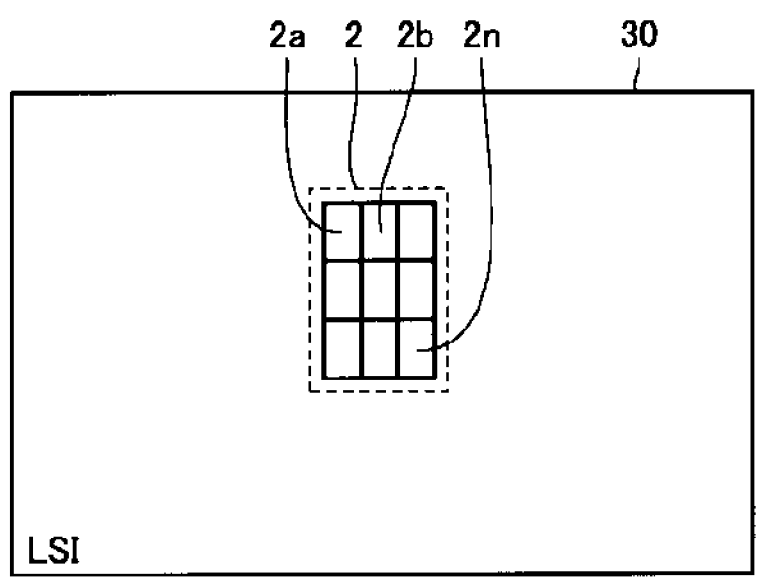
FIG. 7 is a schematic diagram showing a physical arrangement of a flip-flop circuit of the semiconductor device in accordance with Embodiment 3 of the present invention.

FIG. 6 is a schematic diagram showing a configuration of a semiconductor device in accordance with Embodiment 3 of the present invention. FIG. 7 is a schematic diagram showing a physical arrangement of the flip-flop circuit 2 of the semiconductor device in accordance with Embodiment 3 of the present invention. A semiconductor device (an LSI or the like) 30 in FIG. 6 includes the power-on reset circuit 1, the flip-flop circuits 2, and the AND circuit 3. The semiconductor device 30 can generate the signal A having a potential corresponding to "0" (the first state) of the two states of "0" and "1" (the second state). The same symbol is attached to the same component in the semiconductor device 30 as in the semiconductor device 10 in FIG. 1, and the detailed description of the components is omitted.

In the semiconductor device 30, the n pieces of flip-flop circuits 2a to 2n are connected in parallel, and the n pieces of flip-flop circuits 2a to 2n are connected to the AND circuit 3 such that they can generate the signal A having a potential corresponding to initialized "0" even in the operational condition under the inappropriate environment.

The n pieces of flip-flop circuits 2a to 2n are provided adjacent to each other, and are arranged physically close to each other as shown in FIG. 7. Because a process condition hardly varies when the n pieces of flip-flop circuits 2a to 2n are arranged physically close to each other, a transistor size and a line width of each of the flip-flop circuits 2a to 2n become substantially uniform. In addition, because configurations of circuits allocated near the n pieces of flip-flop circuits 2a to 2n are also the same, an external environment to which each of the flip-flop circuits 2a to 2n is subjected is also the same as each other. Therefore, as for each of the flip-flop circuits 2a to 2n, the state held by each of the flip-flop circuits 2a to 2n may be biased toward either one of "0" or "1".

When the state held by each of the flip-flop circuits 2a to 2n is biased toward either one of "0" or "1", the probability that the state held in each of the flip-flop circuits 2a to 2n is all "1" is increased, and the probability that the AND circuit 3 generates the signal A having a potential corresponding to initialized "0" is reduced.

Consequently, in the semiconductor device 30, a negative logic circuit 2b1 is provided at an output of the flip-flop circuit 2b as the flip-flop circuit 2b in FIG. 6, and the negative logic circuit 2b1 logically inverts the states held by the flip-flop circuits 2a forcibly to different states, such that the state held by each of the flip-flop circuits 2a to 2n is prevented from being biased toward either one of "0" or "1". The negative logic circuit 2b1 logically inverts the state held by the flip-flop circuit 2b ("0") to a different state ("1"), and outputs it to the AND circuit 3. A negative logic circuit is not provided only at the flip-flop circuit 2b, but has been similarly provided at the other flip-flop circuits 2a to 2n depending on the bias of the state held by each of the flip-flop circuits 2a to 2n.

As described above, because the semiconductor device 30 in accordance with Embodiment 3 of the present invention includes the negative logic circuit that logically inverts to the different state the state held by at least one of the flip-flop circuits 2a to 2n among the n pieces of flip-flop circuits 2a to 2n, and that outputs it to the AND circuit 3, the state held by each of the flip-flop circuits 2a to 2n can be prevented from being biased toward either one of "0" or "1". The state held by each of the flip-flop circuits 2a to 2n is prevented from being biased toward either one of "0" or "1", and a case is avoided, in which the state held in each of the flip-flop circuits 2a to 2n is all "1". Thus, the probability that the AND circuit 3 generates the signal A having a potential corresponding to initialized "0" is increased.

(Embodiment 4)

Figure 8:
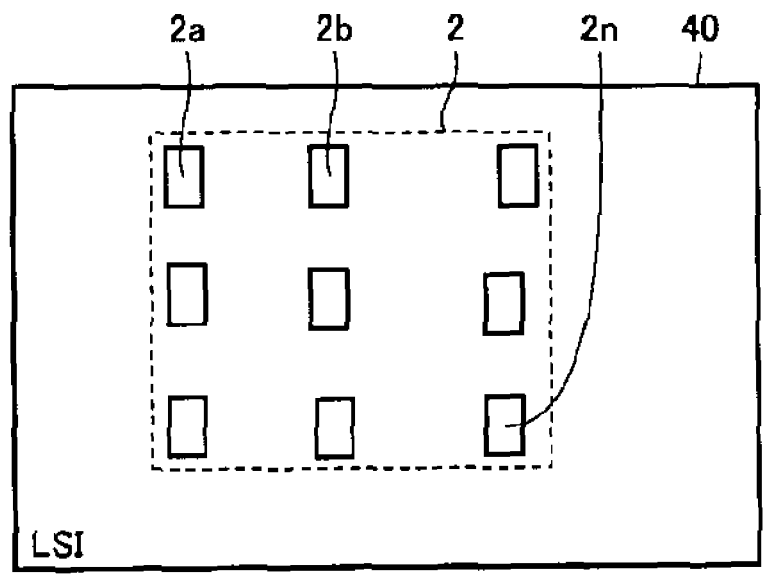
FIG. 8 is a schematic diagram showing a physical arrangement of a flip-flop circuit of a semiconductor device in accordance with Embodiment 4 of the present invention.

FIG. 8 is a schematic diagram showing a physical arrangement of the flip-flop circuit 2 of a semiconductor device in accordance with Embodiment 4 of the present invention.
In a semiconductor device 40 in FIG. 8, the n pieces of flip-flop circuits 2a to 2n are connected in parallel, and the n pieces of flip-flop circuits 2a to 2n are connected to an AND circuit, which is not shown, such that they can generate the signal A having a potential corresponding to initialized "0" even in the operational condition under the inappropriate environment. The semiconductor device 40 has the same configuration as the semiconductor device 10 in FIG. 1. The same component as in the semiconductor device 10 will be described with the same symbol.

When the n pieces of flip-flop circuits 2a to 2n are provided adjacent to each other, and are arranged physically close to each other as shown in FIG. 7, as for each of the flip-flop circuits 2a to 2n, the state held by each of the flip-flop circuits 2a to 2n may be biased toward either one of "0" or "1".

When the state held by each of the flip-flop circuits 2a to 2n is biased toward either one of "0" or "1", the probability that the state held in each of the flip-flop circuits 2a to 2n is all "1" becomes higher, and the probability that the AND circuit 3 generates the signal A having a potential corresponding to initialized "0" becomes lower.

Consequently, each of the n pieces of flip-flop circuits 2a to 2n is arranged physically apart from each other as shown in FIG. 8 in the semiconductor device 40. Because each of the n pieces of flip-flop circuits 2a to 2n is arranged physically apart from each other, a process condition varies, and a transistor size and a line width of each of the flip-flop circuits 2a to 2n change depending on a formed position of each of the flip-flop circuits 2a to 2n. In addition, because each of the n pieces of flip-flop circuits 2a to 2n is arranged physically apart from each other, a circuit configuration near each of the flip-flop circuits 2a to 2n is different from each other depending on the formed position, and thus an external environment to which each of the flip-flop circuits 2a to 2n is subjected, such as crosstalk noise due to adjacent wiring and a logic gate circuit, is also different from each other. Therefore, a probability that the state held by each of the flip-flop circuits 2a to 2n is biased toward either one of "0" or "1" can be reduced.

As described above, since each of the n pieces of flip-flop circuits 2a to 2n is arranged physically apart from each other in the semiconductor device 40 in accordance with Embodiment 4 of the present invention, the state held by each of the flip-flop circuits 2a to 2n can be prevented from being biased toward either one of "0" or "1". The state held by each of the flip-flop circuits 2a to 2n is prevented from being biased toward either one of "0" or "1", and the probability that the state held in each of the flip-flop circuits 2a to 2n is all "1" is reduced. Thus, the probability that the AND circuit 3 generates the signal A having a potential corresponding to initialized "0" is increased.

(Embodiment 5)

FIG. 9 is a schematic diagram showing a configuration of a semiconductor device in accordance with Embodiment 5 of the present invention. In a semiconductor device 50 in FIG. 9, the n pieces of flip-flop circuits 2a to 2n are connected in parallel and in a plurality of numbers, and the n pieces of flip-flop circuits 2a to 2n are connected to an AND circuit which is not shown, such that they can generate the signal A having a potential corresponding to initialized "0" even in the operational condition under the inappropriate environment. Furthermore, a resistive element 51 is arranged near each of the flip-flop circuit 2a to 2n in the semiconductor device 50. The semiconductor device 50 has the same configuration as the semiconductor device 10 in FIG. 1. The same component as in the semiconductor device 10 will be described with the same symbol.

The n pieces of flip-flop circuits 2a to 2n are arranged physically apart from each other as shown in FIG. 8. Because each of the n pieces of flip-flop circuits 2a to 2n is arranged physically apart from each other, a process condition varies, and a transistor size and a line width of each of the flip-flop circuits 2a to 2n change depending on the formed position. In addition, because each of the n pieces of flip-flop circuits 2a to 2n is arranged physically apart from each other, the circuit configuration near each of the flip-flop circuits 2a to 2n is different from each other depending on the formed position, and thus the external environment to which each of the flip-flop circuits 2a to 2n is subjected is also different from each other. Therefore, the probability that the state held by each of the flip-flop circuits 2a to 2n is biased toward either one of "0" or "1" becomes low.

However, when each of the n pieces of flip-flop circuits 2a to 2n is merely arranged physically apart from each other, the probability that the state held by each of the flip-flop circuits 2a to 2n is biased toward either one of "0" or "1" may be still high in some cases.

Consequently, in the semiconductor device 50, as shown in FIG. 9, each of the n pieces of flip-flop circuits 2a to 2n is arranged physically apart from each other, and the resistive element 51 is arranged near each of the flip-flop circuit 2a to 2n. Noise generated in the resistive element affects each of the flip-flop circuits 2a to 2n by arranging the resistive element 51 near each of the flip-flop circuit 2a to 2n, and thus the external environment to which each of the flip-flop circuits 2a to 2n is subjected can be made largely different from each other depending on the formed position of each of the circuits. Therefore, the probability that the state held by each of the flip-flop circuits 2a to 2n is biased toward either one of "0" or "1" becomes lower.

An element arranged near each of the flip-flop circuits 2a to 2n is not limited to the resistive element 51. The element may be a coil and a transistor if the element is a noise generating circuit which generates noise affecting the states held by the flip-flop circuits 2a to 2n.

As described above, because the semiconductor device 50 in accordance with Embodiment 5 of the present invention includes near the flip-flop circuits 2a to 2n the resistive element 51 which generates the noise affecting the held state, the state held by each of the flip-flop circuits 2a to 2n can be prevented from being biased toward either one of "0" or "1". The state held by each of the flip-flop circuits 2a to 2n is prevented from being biased toward either one of "0" or "1", and a probability that the state held in each of the flip-flop circuits 2a to 2n is all "1" is reduced. Thus, the probability that the AND circuit 3 generates the signal A having a potential corresponding to initialized "0" is increased.

The semiconductor device 50 has each of the n pieces of flip-flop circuits 2a to 2n arranged physically apart from each other, and includes the resistive element 51 near the flip-flop circuits 2a to 2n. If the probability that the state held by each of the flip-flop circuits 2a to 2n is biased toward either one of "0" or "1" can be reduced, the semiconductor device may have the n pieces of flip-flop circuits 2a to 2n arranged physically close to each other, and may include the resistive element 51 near the flip-flop circuits 2a to 2n.

In addition, means for reducing the probability that the state held by each of the flip-flop circuits 2a to 2n is biased toward either one of "0" or "1" is not limited to the above-mentioned means. In the semiconductor device, there may be changed a direction in which a transistor constituting each of the flip-flop circuits 2a to 2n is arranged, a size of the transistor, and circuit configurations near the flip-flop circuits 2a to 2n.

The embodiments disclosed should be considered to be illustrative but not restrictive in all respects. The scope of the present invention is shown in claims, not in the above-described description, and equivalents to the claims and all modifications within the claims are intended to be included.

What is claimed is:

1. A semiconductor device which can perform initialization to a first state of two states of the first state and a second state, and which can generate a signal having a potential corresponding to the initialized first state, the semiconductor device comprising:
   a plurality of state holding circuits which are connected in parallel and which can hold the two states of the first state and the second state; and
   a shared logic circuit connected to the plurality of state holding circuits, which generates and outputs a signal having a potential corresponding to the first state when a state held in at least one state holding circuit among the state holding circuits is the first state, the logic circuit being connected to the state holding circuits.

2. The semiconductor device according to claim 1, wherein at least the one state holding circuit among the state holding circuits is logically inverted to a state different from a held state and then outputs the inverted state to the logic circuit.

3. The semiconductor device according to claim 2, wherein each of the state holding circuits is arranged physically apart from each other.

4. The semiconductor device according to claim 3, comprising a noise generating circuit which generates noise affecting a held state near the state holding circuit.

5. The semiconductor device according to claim 4, wherein the noise generating circuit is a resistive element.

6. The semiconductor device according to claim 5, wherein the state holding circuit is a flip-flop circuit or a latch circuit.

7. The semiconductor device according to claim 6, wherein the state holding circuit and the logic circuit are connected to a subsequent stage of a reset circuit or connected in parallel to the reset circuit which generates an initialization signal when a voltage of a power supply that drives the semiconductor device becomes not less than a reference voltage.

8. The semiconductor device according to claim 6, wherein a signal output by the logic circuit is used as an enable signal for reading data stored in a memory circuit.

9. The semiconductor device according to claim 1, wherein the logic circuit is an AND circuit.

10. The semiconductor device according to claim 9, wherein the logic circuit generates the signal having a potential corresponding to the first state when at least one of the state holding circuits is in the first state, and generates a signal having a potential not corresponding to the first state when all of the state holding circuits are in the second state.

* * * * *